United States Patent
Emdadi

(10) Patent No.: US 7,800,438 B2
(45) Date of Patent: Sep. 21, 2010

(54) BYPASS DEVICE FOR MICROWAVE AMPLIFIER UNIT

(75) Inventor: Amir Emdadi, Solna (SE)

(73) Assignee: Powerwave Technologies, Inc., Santa Ana, CA (US)

( * ) Notice: Subject to any disclaimer, the term of this patent is extended or adjusted under 35 U.S.C. 154(b) by 317 days.

(21) Appl. No.: 12/084,445

(22) PCT Filed: Oct. 30, 2006

(86) PCT No.: PCT/SE2006/001221

§ 371 (c)(1), (2), (4) Date: May 1, 2008

(87) PCT Pub. No.: WO2007/053077

PCT Pub. Date: May 10, 2007

(65) Prior Publication Data

US 2009/0256633 A1    Oct. 15, 2009

(30) Foreign Application Priority Data

Nov. 4, 2005    (SE)    .................................. 0502453

(51) Int. Cl.
*H03F 1/14*    (2006.01)
(52) U.S. Cl. ..................... 330/51; 330/124 D
(58) Field of Classification Search .................. 330/51, 330/124 D, 124 R, 295
See application file for complete search history.

(56) References Cited

U.S. PATENT DOCUMENTS 4,910,478 A    3/1990    Koyama (Continued)

FOREIGN PATENT DOCUMENTS

EP    0 670 630 A1    9/1995

(Continued)

OTHER PUBLICATIONS

PCT Written Opinion and citation listing from International Search Report for International Application No. PCT/SE 2006/001221 dated Feb. 21, 2007.

(Continued)

*Primary Examiner*—Henry K Choe
(74) *Attorney, Agent, or Firm*—OC Patent Law Group

(57) ABSTRACT

The invention relates to a bypass device for a microwave amplifier unit, the microwave amplifier unit (1) comprising at least one low noise amplifier (LNA) and amplifying communication signals in at least one microwave frequency band above 500 MHz, the bypass device extending in parallel to said microwave amplifier unit (1), both extending between an input port (3) and an output port (4), in which amplifier unit (1) switching elements (9,10,16,21) for activating said bypass segment (2) in a bypass mode of the device in case said amplifier unit (1) becomes inoperable and for effectively blocking the bypass segment (2) in an active mode of the device are arranged, said bypass segment comprising a series of bypass segment sections (14,19,17) having at least one junction point connected to an associated one of said switching elements (16,21), where each of said bypass segment sections (14:19:17) comprises at least two coupled transmission lines (31,32;31,33,32;31,34,32:51,52;51,53,52:41, 42;41, 43,42;41,44,42), where the coupled transmission lines form sets (31,32,51,52,42,41;31,33,32,51,52,42,41;31,34, 32,51,53,52,42,44,41) of transmission lines, where only one of the sets is in use at a time, and where each set of coupled transmission lines optimizes the bypass segment (2) to different operating frequencies, whereby the bypass segment is able to operate properly in the bypass mode at more than one frequency.

10 Claims, 3 Drawing Sheets

U.S. PATENT DOCUMENTS

| | | | |
|---|---|---|---|
| 7,215,192 B2 * | 5/2007 | Kim et al. | 330/51 |
| 7,348,841 B2 * | 3/2008 | Kim et al. | 330/51 |
| 7,385,445 B2 * | 6/2008 | Wright | 330/51 |
| 2004/0185819 A1 | 9/2004 | Kyllonen et al. | |

FOREIGN PATENT DOCUMENTS

| | | |
|---|---|---|
| EP | 1345322 | 9/2003 |
| GB | 2362046 | 11/2001 |
| WO | WO 02052722 A | 7/2002 |

OTHER PUBLICATIONS

Markner, Henrik, et al., *A 1.7mA Low Noise Amplifier with Intregrated Bypass Switch for Wireless 0.05-6 GHz Portable Applications*, 2001 IEEE Radio Frequency Integrated Circuits Symposium, TUE4A-4, pp. 235-238.

* cited by examiner

BYPASS DEVICE FOR MICROWAVE AMPLIFIER UNIT

FIELD OF THE INVENTION

The present invention relates to a bypass device for an amplifier unit for amplifying communication signals in the frequency range from 500 Mhz (including microwave frequencies). The bypass device comprises a transmission line bypass segment extending in parallel to the amplifier. The bypass segment is automatically activated when the amplifier unit becomes inoperative, e.g. due to failure of some RF component or DC failure, and is effectively blocked during normal operation of the amplifier unit.

BACKGROUND OF THE INVENTION AND RELATED ART

Amplifier units are being used e.g. directly at the top of an antenna mast or tower in cellular mobile telephone systems. Such an amplifier unit is a critical component in the overall system and it is very important that it is operable at all times. Thus, even if the amplifier unit becomes inoperable for some reason, the signal must be passed on somehow to the base station located adjacent to the bottom of the antenna mast or tower.

It is previously known to connect a bypass segment in parallel to the amplifier in combination with switching means whereby the bypass segment is activated in case any of the amplifier transistors break down or the feeding power to the amplifier is interrupted.

SUMMARY OF THE INVENTION

The primary object of the present invention is to provide an improved bypass device, which is inexpensive and operates properly in the bypass mode at more than one frequency.

The above mentioned object is achieved for a device having the features stated in claim 1. Thus, the bypass segment of the device according to the invention comprises at least one section of multiple transmission lines, whereby different operating frequencies may be chosen.

These and other advantageous features will be apparent from the detailed description below.

The invention will now be described in more detail below with reference to the appended drawings which illustrate preferred embodiments of the device according to the invention.

DESCRIPTION OF PREFERRED EMBODIMENTS

Figure 1:
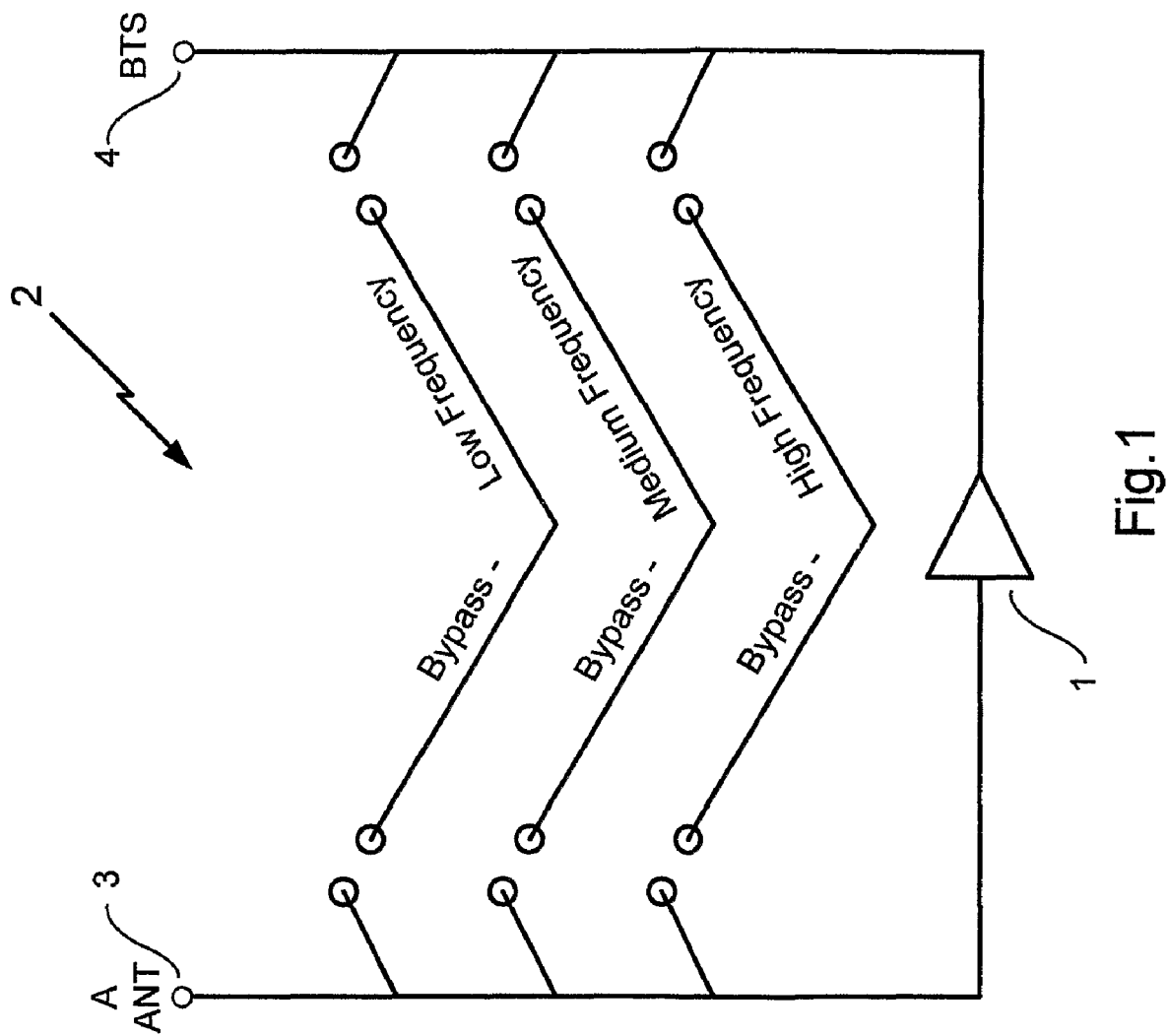
FIG. 1 shows schematically a simple circuit including a bypass segment according to the invention.

The same reference numerals are being used for similar features in the different drawings.

FIG. 1 shows schematically a simple circuit including a bypass segment according to the invention. The circuitry shown in FIG. 1 is an arrangement connected to an antenna A. Typically, the antenna A and the low noise amplifier LNA are mounted at the top of a mast or a tower included in a cellular mobile telephone system. Normally there is a base station adjacent the bottom of the mast or tower, the base station having various equipment for maintaining and monitoring the operation of the base station.

The low noise amplifier LNA has the task of amplifying received communication signals, in a predetermined microwave frequency band in a frequency range above 500 MHz, before these signals become significantly attenuated along a transmission line (not shown) to a base station located adjacent to the bottom of the antenna mast or tower.

Figure 2:
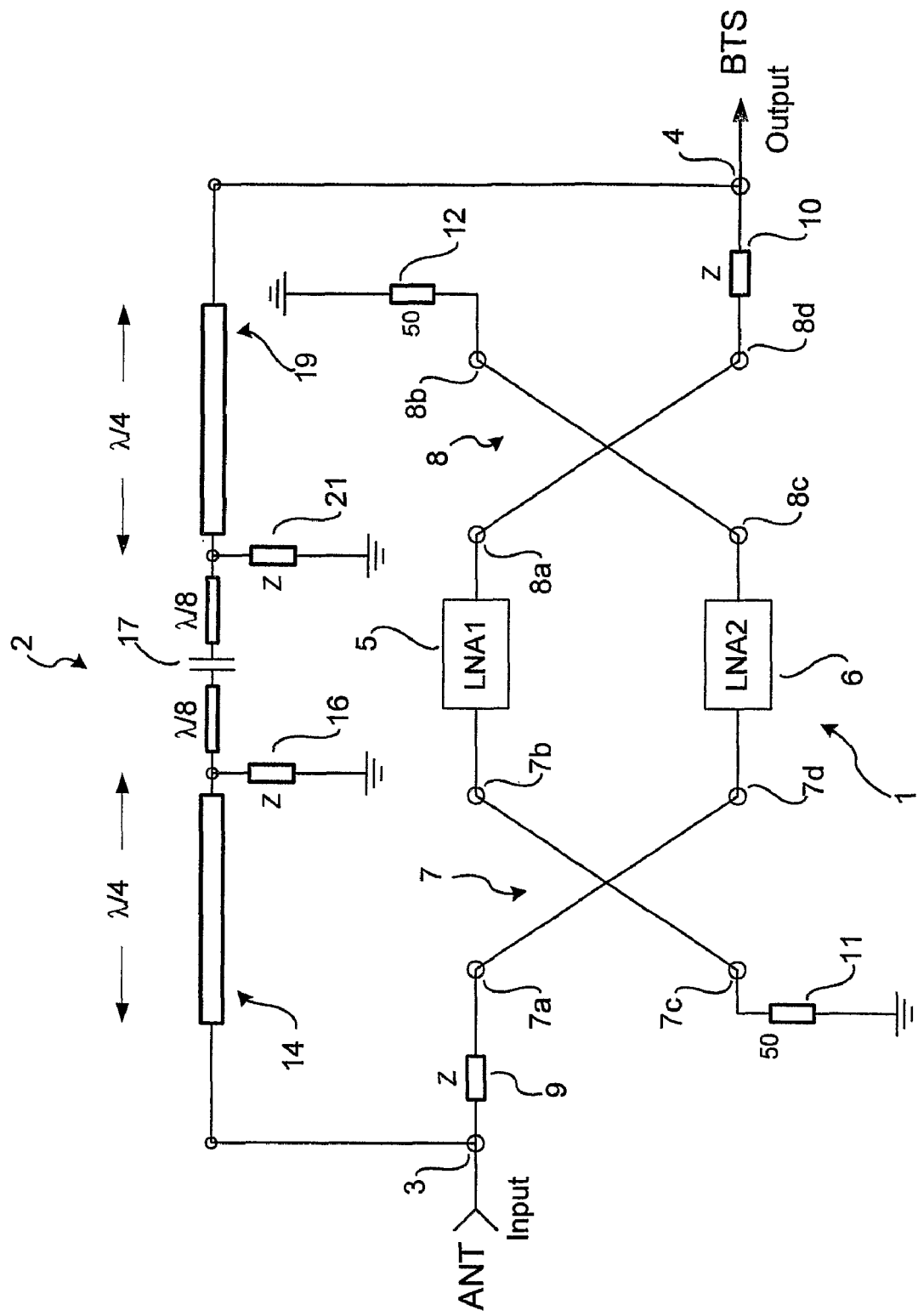
FIG. 2 shows schematically a portion of an amplifier unit with the major components and transmission lines on a circuit card.

FIG. 2 shows schematically a portion of an amplifier unit with the major components and transmission lines on a circuit card. The amplifier unit 1 is inserted between an input port 3 and an output port 4, the bypass segment 2 being arranged in parallel to the amplifier unit 1, likewise between the input and output ports 3,4.

The amplifier unit may e.g. comprise two low noise amplifiers (LNA) 5,6 arranged in parallel between an input hybrid coupler 7 and an output hybrid coupler 8. An input hybrid port 7*a* is connected to the input port 3 via a switching element 9, whereas an output hybrid port 8*d* is connected to the output port 4 via a switching element 10. An isolated port 7*c* of the input hybrid coupler 7 is connected to ground via a 50 ohm impedance element 11, and the other output port 8*b* is likewise connected to ground via a 50 ohm impedance element 12.

So, the two amplifiers 5,6 are single-ended and are coupled between the input and output ports 3,4 in a fully balanced configuration. In the normal operation of the device, during which the four switching elements 9,10,16,21 are controlled to a very low impedance value, the input signal appearing on the input hybrid port 7*a* is coupled in equal proportions to the hybrid output ports 7*b*,7*d*, whereas the output signals from the amplifiers 5,6 are coupled from the hybrid ports 8*a*,8*c* to the hybrid output port 8*d* and the output port 4 via the switching element 10. Preferably, the hybrid couplers 7 and 8 are constituted by Lange couplers or modified Lange couplers. However, it is also possible to use any other 3 dB 90 degrees hybrid coupler.

Thanks to the balanced configuration of the two low noise amplifiers 5,6, the amplifier unit I is operative in a relative broad frequency band with a substantially constant gain.

According to the present invention, the bypass segment 2 is designed in such a way that it operates properly in the bypass mode at more than one frequency.

The bypass segment 2 is provided with a first bypass segment section 14 connected A between the input port 3 of the device and a switching element 16, and a second bypass segment section 19 connected between the output port 4 of the device and a switching element 21, the impedance of the switching elements 16,21 being automatically and/or 3 remotely controllable, e.g. by a control circuit (not shown) located in the amplifier/bypass device or at an associated base station. A third bypass segment section 17 is connected between the first bypass segment section 14 and the second bypass segment section 19.

A controllable switching element of the type mentioned above may be constituted by a diode, a bipolar transistor, a field effect transistor or an electromechanical relay. In any case, the switching elements 16,21 are switched between a very high impedance, such as 5 kohm, and a relatively low impedance, such as 1-10 ohm.

Figure 3:
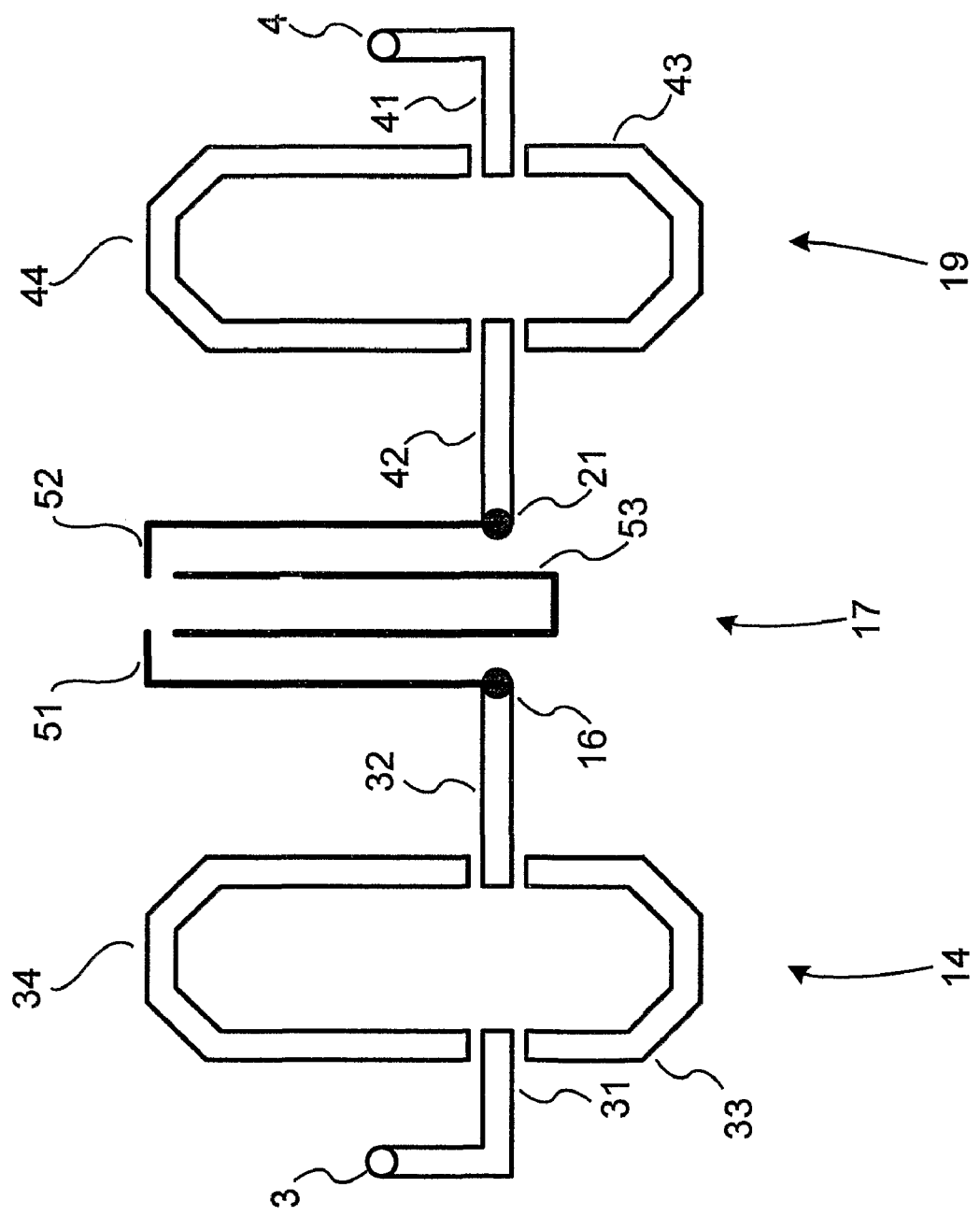
FIG. 3 shows schematically a bypass segment according to one embodiment of the invention.

FIG. 3 shows schematically a bypass segment according to one embodiment of the invention. In order for the bypass segment to be able to operate properly in the bypass mode at more than one frequency, the different bypass segment sections 14,19,17 are arranged with parallel transmission paths of which only one is in use at a time.

Below, the first bypass segment section 14 will be described. This description also applies to the second bypass segment section 19 it being of similar type. For the second bypass segment section 19 reference numerals 41,42,43,44 should be used instead of 31,32,33,34, reference numeral 21 instead of 16, and "output port 4" instead of "input port 3".

The first bypass segment section 14 comprises in this embodiment four transmission lines 31,32,33,34 arranged at a distance from one another. The first transmission line 31 is electrically connected to the input port 3 and the second transmission line 32 is electrically connected to the switching element 16. The third and fourth transmission lines 33,34 are arranged between the free ends of the first and second transmission lines 31,32, and where the third transmission line 33 is electrically shorter in length than the fourth transmission line 34.

The bypass segment section 14 will have a length being ¼ of the wavelength possibly added with a number N of half wavelengths, N=0,1,2, . . . , which length is obtained by connecting the transmission lines 31,32,33,34 in the bypass segment 14 in different ways depending on which wavelength the bypass segment 14 is intended for. The wavelength refers to a frequency within the microwave frequency band being used, e.g. a central frequency in such a band.

The first transmission line 31 may be connected to the second transmission line 32 in three different ways:

firstly, a direct 0-Ohm connection between the free end of the first transmission line 31 and the free end of the second transmission line 32 which results in the electrically shortest bypass segment section 14 (preferably having a length being ¼ of the 1900 MHz- or UMTS-wavelength possibly added with a number N of half wavelengths, N=0,1,2, . . . );

secondly: a 0-Ohm connection between the free end of the first transmission line 31 and the first free end of the third transmission line 33, and a 0-Ohm connection between the free end of the second transmission line 32 and the second free end of the third transmission line 33 which results in a bypass segment section 14 of medium electrical length (preferably having a length being ¼ of the 1800 MHz-wavelength possibly added with a number N of half wavelengths, N=0,1,2, . . . );

thirdly: a 0-Ohm connection between the free end of the first transmission line 31 and the first free end of the fourth transmission line 34, and a 0-Ohm connection between the free end of the second transmission line 32 and the second free end of the fourth transmission line 34 which results in the electrically longest bypass segment section 14 (preferably having a length being ¼ of the 900 MHz- or AMPS-wavelength possibly added with a number N of half wavelengths, N=0,1,2, . . . ).

The third bypass segment section 17 comprises in this embodiment three transmission lines 51,52,53 arranged at a distance from one another, the transmission lines 51,52,53 having >>z than those in the first and the second bypass segment sections 14,19. The first transmission line 51 is electrically connected to the switching element 16 and the second transmission line 52 is electrically connected to the switching element 21. The third transmission line 53 is arranged between the free ends of the first and second transmission lines 51,52.

The bypass segment section 17 will also have a length being ¼ of the wavelength possibly added with a number N of half wavelengths, N=0,1,2, . . . , which length is obtained by connecting the transmission lines 51,52,53 in the bypass segment 17 in different ways depending on which wavelength the bypass segment is intended for. The wavelength refers to a frequency within the microwave frequency band being used, e.g. a central frequency in such a band.

The first transmission line 51 may be connected to the second transmission line 52 in two different ways:

firstly, a direct 0-Ohm connection between the free end of the first transmission line 51 and the free end of the second transmission line 52 which results in the electrically i shortest bypass segment section 17 (preferably having a length being ¼ of the 1800 Mhz-, 1900 MHz- or UMTS-wavelength possibly added with a number N of half wavelengths, N=0,1,2, . . . );

secondly: a 0-Ohm connection between the free end of the first transmission line 51 and the first free end of the third transmission line 53, and a 0-Ohm connection between the free end of the second transmission line 52 and the second free end of the third transmission line 53 which results in the electrically longest bypass segment section 17 (preferably having a length being ¼ of the 900 MHz- or AMPS-wavelength possibly added with a number N of half wavelengths, N=0,1,2, . . . ).

It is also possible to connect the transmission lines in the first bypass segment section 14 and the second bypass segment section 19 in the same way as has been described for the third bypass segment section 17. However, this way of connecting the transmission lines in the first bypass segment section 14 and the second bypass segment section 19 will result in a decrease in efficiency. This way of connecting the transmission lines is sufficient for the third bypass segment section as the need for accuracy is not equally important in that case.

When the switching elements 9,10,16,21 are controlled to a state of very high impedance, which is the case when the amplifier unit is inoperable for one reason or another (bypass mode), e.g. due to a failure of a RF component or a failure of the DC current driving the unit, the bypass segment section 14 will be electrically open ended (its length being ¼ of the wavelength possibly added with a number N of half wavelengths, N=0,1,2, . . . ). The wavelength refers to a frequency within the microwave frequency band being used, e.g. a central frequency in such a band.

A communication signal applied to the input port 3 will therefore propagate via the first bypass segment section 14, via a third, centrally located bypass segment section 17, and via a second bypass segment section 19. The latter bypass segment section 19 is identical to the first bypass segment section 14 and the bypass segment section 19 is connected between the output port 4 of the device and a remotely controllable switching element 21 similar or identical to the element 16. The four switching elements 9,10,16,21 are controlled in synchronism so as to be either in a high impedance state or in a low impedance state at the same time.

However, when the amplifier unit 1 operates normally (active mode), the four switching elements 9,10,16,21 are controlled to a state of relatively low impedance, whereby the bypass segment is cut off. An input signal on the input port 3 will then propagate through the amplifiers 5,6 to the output port 4. In the illustrated embodiment, the isolation across the bypass segment 2 is very high, approximately 55 dB, and there is no risk of feedback.

On the other hand, in the bypass mode the insertion loss in the bypass segment 2 is very low, approximately 1 dB.

Furthermore, in active mode, thanks to the low impedance of the associated switching elements 16 and 21 in the bypass segment, the bypass input impedance in this active mode is relatively high, whereby the balanced operation of the two low noise amplifiers 5,6 is maintained. Irrespective of the state of the hybrid couplers 7,8, such a balanced operation will be retained since the effective input and output loads of the amplifiers 5,6 are unaffected by the bypass segment. Consequently, the noise factor is very low, and the input and output reflections are likewise low.

The invention thus relates to a bypass device for a microwave amplifier unit, the microwave amplifier unit 1 comprising at least one low noise amplifier (LNA) and amplifying communication signals in at least one microwave frequency band above 500 MHz, the bypass device extending in parallel to said microwave amplifier unit 1, both extending between an input port 3 and an output port 4, in which amplifier unit 1 switching elements 9,10,16,21 for activating said bypass segment 2 in a bypass mode of the device in case said amplifier unit 1 becomes inoperable and for effectively blocking the bypass segment 2 in an active mode of the device are arranged, said bypass segment comprising a series of bypass segment sections 14,19,17 having at least one junction point connected to an associated one of said switching elements 16,21, where each of said bypass segment sections 14:19:17 comprises at least two coupled transmission lines 31,32;31, 33,32;31,34,32:51,52;51,53,52:41,42;41,43,42;41,44,42, where the coupled transmission lines form sets 31,32,51,52, 42,41;31,33,32,51,52,42,43,41;31,34,32,51,53,52,42,44,41 of transmission lines, where only one of the sets is in use at a time, and where each set of coupled transmission lines optimizes the bypass segment 2 to different operating frequencies, whereby the bypass segment is able to operate properly in the bypass mode at more than one frequency.

The device may be modified within the scope defined by the appended claims. For example, the bypass segment does not have to be arranged on the same circuit board as the amplifier stage, but can be mounted on a circuit board of its own, i.e. the bypass device may be arranged on the same printed circuit board (PCB) as the amplifier unit 1, or on a printed circuit board (PCB) separate from the printed circuit board (PCB) comprising the amplifier unit 1.

The invention claimed is:

1. Bypass device for a microwave amplifier unit, the microwave amplifier unit comprising at least one low noise amplifier (LNA) and amplifying communication signals in at least one microwave frequency band above 500 MHz, the bypass device extending in parallel to said microwave amplifier unit, both extending between an input port and an output port, in which amplifier unit switching elements for activating said bypass segment in a bypass mode of the device in case said amplifier unit becomes inoperable and for effectively blocking the bypass segment in an active mode of the device are arranged, said bypass segment comprising a series of bypass segment sections having at least one junction point connected to an associated one of said switching elements, wherein each of said bypass segment sections comprises at least two coupled transmission lines, where the coupled transmission lines form sets of transmission lines, where only one of the sets is in use at a time, and where each set of coupled transmission lines optimizes the bypass segment to different operating frequencies, whereby the bypass segment is able to operate properly in the bypass mode at more than one frequency.

2. Bypass device according to claim 1, wherein the first and second bypass segment section, respectively, comprises four transmission lines arranged at a distance from one another, where the first transmission line is electrically connected to the input port and the output port, respectively, and the second transmission line is electrically connected to the switching element, and where the third and fourth transmission lines are arranged between the free ends of the first and second transmission lines, and where the third transmission line is electrically shorter in length than the fourth transmission line.

3. Bypass device according to claim 2, wherein the third bypass segment section comprises three transmission lines arranged at a distance from one another, the transmission lines having >>z than those in the first and the second bypass segment sections, and where the first transmission line is electrically connected to the switching element and the second transmission line is electrically connected to the switching element, and where the third transmission line is arranged between the free ends of the first and second transmission lines.

4. Bypass device according to claim 2, wherein the first, second and third bypass segment sections have a length being ¼ of the wavelength possibly added with a number N of half wavelengths, N=0,1,2, . . . , which length is obtained by connecting the transmission lines in the bypass segment in different ways depending on which wavelength the bypass segment is intended for.

5. Bypass device according to claim 1, wherein a first set of transmission lines results in the electrically shortest bypass segment having a length being ¼ of the 1900 MHz- or UMTS- wavelength possibly added with a number N of half wavelengths, N=0,1,2, . . . .

6. Bypass device according to claim 1, wherein a second set of transmission lines results in a bypass segment of medium electrical length having a length being ¼ of the 1800 MHz- wavelength possibly added with a number N of half wavelengths, N=0,1,2, . . . .

7. Bypass device according to claim 1, wherein a fourth set of transmission lines results in the electrically shortest bypass segment having a length being ¼ of the 1900 MHz-, UMTS-, or 1800 MHz- wavelength possibly added with a number N of half wavelengths, N=0,1,2, . . . .

8. Bypass device according to claim 1, wherein a third set of transmission lines results in the electrically longest bypass segment having a length being ¼ of the 900 MHz- or AMPS- wavelength possibly added with a number N of half wavelengths, N=0,1,2, . . . .

9. Bypass device according to claim 1, wherein the bypass device is arranged on the same printed circuit board (PCB) as the amplifier unit.

10. Bypass device according to claims 1, wherein the bypass device is arranged on a printed circuit board (PCB) separate from the printed circuit board (PCB) comprising the amplifier unit.

* * * * *